US010770552B2

United States Patent
Ichimura et al.

(10) Patent No.: US 10,770,552 B2
(45) Date of Patent: Sep. 8, 2020

(54) EPITAXIAL SUBSTRATE FOR SEMICONDUCTOR ELEMENTS, SEMICONDUCTOR ELEMENT, AND MANUFACTURING METHOD FOR EPITAXIAL SUBSTRATES FOR SEMICONDUCTOR ELEMENTS

(71) Applicant: NGK INSULATORS, LTD., Nagoya-shi, Aichi (JP)

(72) Inventors: Mikiya Ichimura, Ichinomiya (JP); Sota Maehara, Nagoya (JP); Yoshitaka Kuraoka, Okazaki (JP)

(73) Assignee: NGK INSULATORS, LTD., Nagoya-shi, Aichi (JP)

( * ) Notice: Subject to any disclaimer, the term of this patent is extended or adjusted under 35 U.S.C. 154(b) by 0 days.

(21) Appl. No.: 16/733,320

(22) Filed: Jan. 3, 2020

(65) Prior Publication Data
US 2020/0144373 A1 May 7, 2020

Related U.S. Application Data

(60) Division of application No. 15/962,300, filed on Apr. 25, 2018, now Pat. No. 10,629,688, which is a (Continued)

(30) Foreign Application Priority Data

Jan. 14, 2016 (JP) ................................ 2016-005115

(51) Int. Cl.
*H01L 21/02* (2006.01)
*H01L 29/20* (2006.01)
(Continued)

(52) U.S. Cl.
CPC ........ *H01L 29/2003* (2013.01); *C23C 16/303* (2013.01); *C30B 25/02* (2013.01); (Continued)

(58) Field of Classification Search
CPC ........ C23C 16/303; C30B 25/02; C30B 29/38
(Continued)

(56) References Cited

U.S. PATENT DOCUMENTS

2013/0075786 A1  3/2013  Ishiguro
2013/0105817 A1* 5/2013  Saunier ............... H01L 29/7787
                                                             257/77

FOREIGN PATENT DOCUMENTS

JP   2011-068548 A   4/2011
JP   2011-187643 A   9/2011
(Continued)

OTHER PUBLICATIONS

Taiwan Office Action for corresponding application No. 105134695, dated Feb. 6, 2020 (5 pages).
(Continued)

*Primary Examiner* — Long K Tran
(74) *Attorney, Agent, or Firm* — Flynn Thiel, P.C.

(57) ABSTRACT

An epitaxial substrate for semiconductor elements suppresses leakage current and has a high breakdown voltage. The epitaxial substrate for semiconductor elements includes: a semi-insulating free-standing substrate formed of GaN doped with Zn; a buffer layer formed of a group 13 nitride adjacent to the free-standing substrate; a channel layer formed of a group 13 nitride adjacent to the buffer layer; and a barrier layer formed of a group 13 nitride on an opposite side of the buffer layer with the channel layer therebetween, wherein part of a first region consisting of the free-standing substrate and the buffer layer is a second region containing Si at a concentration of $1\times10^{17}\text{cm}^{-3}$ or more, and a minimum value of a concentration of Zn in the second region is $1\times10^{17}\text{cm}^{-3}$.

8 Claims, 4 Drawing Sheets

Related U.S. Application Data continuation of application No. PCT/JP2016/079616, filed on Oct. 5, 2016.

(60) Provisional application No. 62/249,537, filed on Nov. 2, 2015.

(51) Int. Cl.

| | |
|---|---|
| *H01L 29/66* | (2006.01) |
| *H01L 29/205* | (2006.01) |
| *C30B 29/38* | (2006.01) |
| *C30B 25/02* | (2006.01) |
| *C30B 29/40* | (2006.01) |
| *H01L 29/36* | (2006.01) |
| *H01L 29/778* | (2006.01) |
| *C23C 16/30* | (2006.01) |
| *H01L 29/207* | (2006.01) |

(52) U.S. Cl.
CPC ............ *C30B 29/38* (2013.01); *C30B 29/406* (2013.01); *H01L 21/0242* (2013.01); *H01L 21/0254* (2013.01); *H01L 21/0262* (2013.01); *H01L 21/02389* (2013.01); *H01L 21/02458* (2013.01); *H01L 29/205* (2013.01); *H01L 29/36* (2013.01); *H01L 29/66462* (2013.01); *H01L 29/778* (2013.01); *H01L 29/7786* (2013.01); *H01L 29/207* (2013.01)

(58) Field of Classification Search
USPC .................................................. 438/285, 590
See application file for complete search history.

(56) References Cited

FOREIGN PATENT DOCUMENTS

| | | |
|---|---|---|
| JP | 2012-060110 A | 3/2012 |
| JP | 2013-074211 A | 4/2013 |
| JP | 2013-197357 A | 9/2013 |
| TW | 2012-14700 A1 | 4/2012 |

OTHER PUBLICATIONS

AlGaN/GaN Heterostructure Field-Effect Transistors on Fe-Doped GaN substrates with High Breakdown Voltage, by Y. Oshimura et al, Japanese Journal of Applied Physics, vol. 50, 2011, pp. 084102-1 through 084102-5 (5 pgs).

Comparison of the DC and Microwave Performance of AlGaN/GaN HEMTs Grown on SiC by MOCVD with Fe-Doped or Unintentionally Doped GaN Buffer Layers, by V. Desmaris et al, IEEE Transactions on Electron Devices, vol. 53, No. 9, 2006, pp. 2413-2417 (5 pgs).

Inhibition of interface pollution in AlGaN/GaN HEMT structures regrown on semi-insulating GaN templates, by M. Azize et al, ScienceDirect, Journal of Crystal Growth, vol. 299, 2007, pp. 103-108 (6 pgs).

English International Preliminary Report on Patentability for corresponding PCT/JP2016/079616, dated May 8, 2018 (1 pg).

English translation of Written Opinion of the International Searching Authority for corresponding PCT/JP2016/079616, dated Dec. 27, 2016 (6 pgs).

English International Search Report for corresponding PCT/JP2016/079616, dated Dec. 27, 2016 (2 pgs).

* cited by examiner

F I G. 1
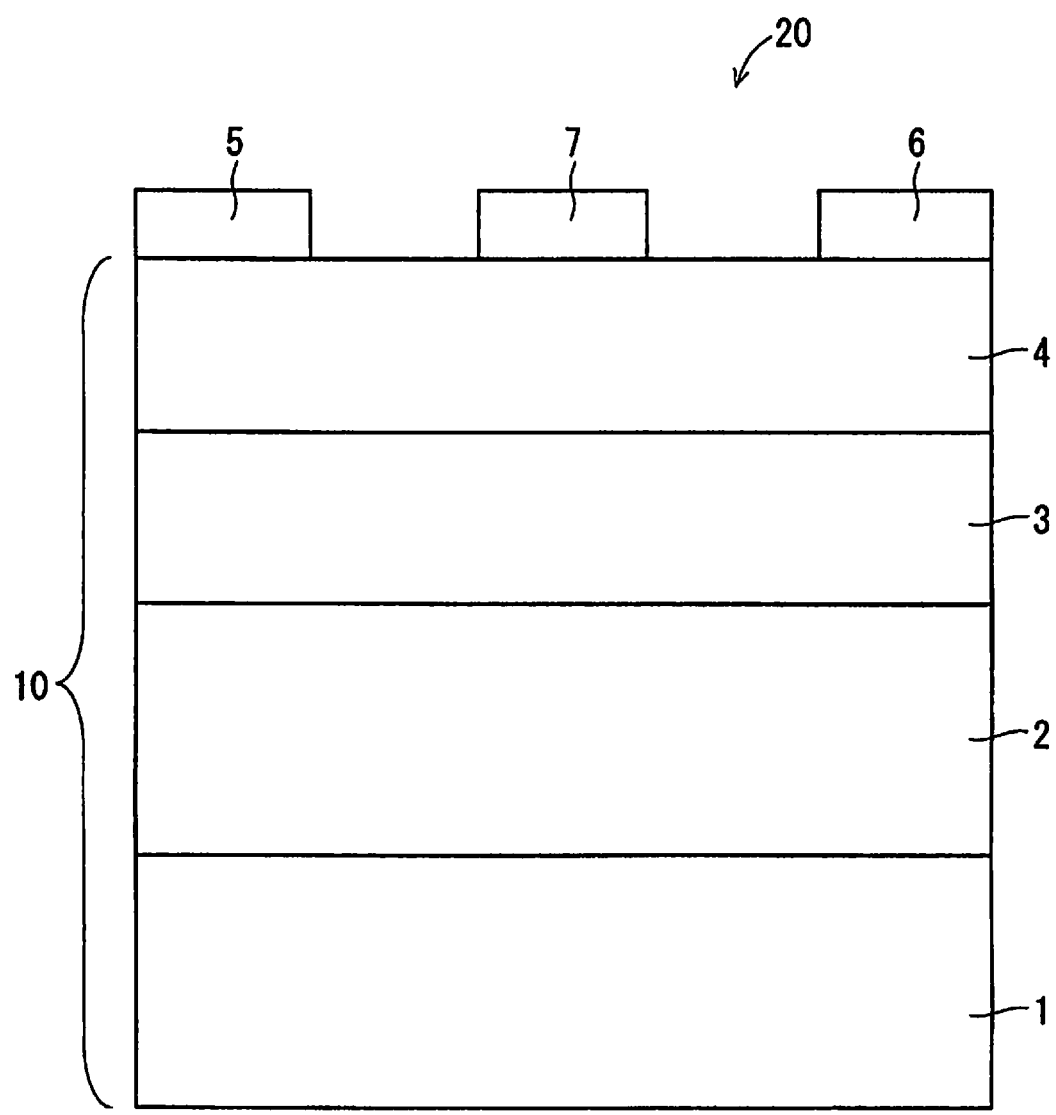

EPITAXIAL SUBSTRATE FOR SEMICONDUCTOR ELEMENTS, SEMICONDUCTOR ELEMENT, AND MANUFACTURING METHOD FOR EPITAXIAL SUBSTRATES FOR SEMICONDUCTOR ELEMENTS

CROSS-REFERENCE TO RELATED APPLICATIONS

This is a divisional of prior U.S. application Ser. No. 15/962 300, filed Apr. 25, 2018, which is a continuation of International Application No. PCT/JP2016/079616, filed Oct. 5, 2016, which claims the benefit of U.S. Provisional Application No. 62/249 537, filed Nov. 2, 2015 and Japanese Application No 2016-005115, filed Jan. 14, 2016, all of which are hereby incorporated by reference herein in their entirety.

TECHNICAL FIELD

The present invention relates to a semiconductor element, and particularly to a semiconductor element constituted by using a free-standing substrate formed of semi-insulating GaN.

BACKGROUND ART

Nitride semiconductors, which have a direct-transition-type wide band gap, high breakdown electric field, and high saturation electron velocity, have been used as light emission devices such as LED or LD and semiconductor materials for high-frequency/high-power electronic devices.

Typical structures of the nitride electronic devices include a high electron mobility transistor (HEMT) structure which is formed by laminating AlGaN as "a barrier layer" and GaN as "a channel layer". This structure utilizes a feature that a high concentration two-dimensional electron gas is generated at an AlGaN/GaN lamination interface owing to large polarization effects (spontaneous polarization effect and piezo polarization effect) inherent in nitride materials.

The nitride electronic devices are generally manufactured using different material base substrates such as sapphire, SiC, and Si which are easily available in a commercial way. However, there arises a problem that large numbers of defects occur in a GaN film which is heteroepitaxially grown on the different material substrates due to a difference in lattice constant and heat expansion coefficient between GaN and the different material substrates.

In the meanwhile, when the GaN film is homoepitaxially grown on a GaN substrate, the defect caused by the difference in lattice constant and heat expansion coefficient described above does not occur, but the GaN film shows a favorable crystalline nature.

Accordingly, when the nitride HEMT structure is manufactured on the GaN substrate, mobility of the two-dimensional electron gas at the AlGaN/GaN lamination interface is enhanced, thus a characteristic improvement of an HEMT element (semiconductor element) manufactured using the above structure can be expected.

However, the GaN substrate manufactured by a hydride vapor phase epitaxial growth method (HVPE method), which can be commercially available, generally has an n-type conductivity due to an oxygen impurity incorporated into a crystal. The conductive GaN substrate serves as a leakage current pathway between source-drain electrodes when the HEMT element is driven at high voltage. Thus, it is preferable to use the semi-insulating GaN substrate to manufacture the HEMT element.

It is known to be efficient to perform doping of an element such as a transition metal element (Fe, for example) or group 2 element (Mg, for example) which forms a deep acceptor level in the GaN crystal to achieve the semi-insulating GaN substrate.

It is already known that when zinc element (Zn) is adopted from a group 2 element, a high-quality semi-insulating GaN single-crystal substrate can be achieved (for example, refer to Patent Document 1). Also known is an aspect that a high-resistance layer doped with iron (Fe), which is a transition metal element, is formed on a substrate, and an intermediate layer having a high effect of incorporating Fe is further formed between the high-resistance layer and an electron transit layer, thereby preventing Fe from being incorporated into the electron transit layer (for example, refer to Patent Document 2).

A manufacture of the HEMT structure on the semi-insulating GaN substrate or a substrate with the semi-insulating GaN film to evaluate each characteristic has been already performed (for example, refer to Non-Patent Document 1 to Non-Patent Document 3).

When the nitride film is epitaxially grown on the semi-insulating GaN substrate, silicon (Si) element may be incorporated into an interface between the semi-insulating GaN substrate and the nitride film (nitride epitaxial film) from outside. Since the silicon (remaining silicon) serves as a donor element, a conductive layer is generated at the nitride film/substrate interface. Since the conductive layer serves as a leakage pathway of drain-source current in the HEMT element, thereby causing a reduction in pinch-off characteristics and breakdown voltage.

PRIOR ART DOCUMENTS

Patent Documents
  Patent Document 1: Japanese Patent No. 5039813
  Patent Document 2: Japanese Patent Application Laid-Open No. 2013-74211
Non-Patent Documents
  Non-Patent Document 1: Yoshinori Oshimura, Takayuki Sugiyama, Kenichiro Takeda, Motoaki Iwaya, Tetsuya Takeuchi, Satoshi Kamiyama, Isamu Akasaki, and Hiroshi Amano, "AlGaN/GaN Heterostructure Field-Effect Transistors on Fe-Doped GaN Substrates with High Breakdown Voltage", Japanese Journal of Applied Physics, vol. 50 (2011), p. 084102-1-p. 084102-5.
  Non-Patent Document 2: V. Desmaris, M. Rudzinski, N. Rorsman, P. R. Hageman, P. K. Larsen, H. Zirath, T. C. Rodle, and H. F. F. Jos, "Comparison of the DC and Microwave Performance of AlGaN/GaN HEMTs Grown on SiC by MOCVD With Fe-Doped or Unintentionally Doped GaN Buffer Layers", IEEE Transactions on Electron Devices, Vol. 53, No. 9, pp. 2413-2417, September 2006.
  Non-Patent Document 3: M. Azize, Z. Bougrioua, and P. Gibart, "Inhibition of interface pollution in AlGaN/GaN HEMT structures regrown on semi-insulating GaN templates", Journal of Crystal Growth vol. 299 (2007) p. 103-p. 108.

SUMMARY

The present invention relates to a semiconductor element, and particularly to a semiconductor element constituted by using a free-standing substrate formed of semi-insulating GaN.

According to the present invention, an epitaxial substrate for semiconductor elements includes: a semi-insulating free-standing substrate formed of GaN doped with Zn; a buffer layer formed of a group 13 nitride adjacent to the free-standing substrate; a channel layer formed of a group 13 nitride adjacent to the buffer layer; and a barrier layer formed of a group 13 nitride on an opposite side of the buffer layer with the channel layer therebetween, wherein part of a first region consisting of the free-standing substrate and the buffer layer includes a second region containing Si at a concentration of $1 \times 10^{17} \text{cm}^{-3}$ or more, and a minimum value of a concentration of Zn in the second region is $1 \times 10^{17} \text{cm}^{-3}$.

According to another aspect of the present invention, a semiconductor element includes: a semi-insulating free-standing substrate formed of GaN doped with Zn; a buffer layer formed of a group 13 nitride adjacent to the free-standing substrate; a channel layer formed of a group 13 nitride adjacent to the buffer layer; a barrier layer formed of a group 13 nitride on an opposite side of the buffer layer with the channel layer therebetween; and a gate electrode, a source electrode, and a drain electrode provided on the barrier layer, wherein part of a first region consisting of the free-standing substrate and the buffer layer is a second region containing Si at a concentration of $1 \times 10^{17} \text{cm}^{-3}$ or more, and a minimum value of a concentration of Zn in the second region is $1 \times 10^{17} \text{cm}^{-3}$.

According to still another aspect of the present invention, a method of manufacturing an epitaxial substrate for semiconductor elements includes: a) a preparation step of preparing a semi-insulating free-standing substrate formed of GaN doped with Zn; b) a buffer layer formation step of forming a buffer layer formed of a group 13 nitride adjacent to the free-standing substrate; c) a channel layer formation step of forming a channel layer formed of a group 13 nitride adjacent to the buffer layer; and d) a barrier layer formation step of forming a barrier layer formed of a group 13 nitride in a position opposite to the buffer layer with the channel layer therebetween, wherein a second region containing Si at a concentration of $1 \times 10^{17} \text{cm}^{-3}$ or more is formed through taking Si in said free-standing substrate, which has been prepared in said preparation step, from outside before said buffer layer formation step is completed, in part of a first region consisting of the free-standing substrate and the buffer layer, and in the buffer layer formation step, Zn is diffused from the free-standing substrate, thereby forming the buffer layer in which a minimum value of a concentration of Zn is $1 \times 10^{17} \text{cm}^{-3}$ in the second region.

According to the present invention, the leakage current is reduced in driving the semiconductor element, and breakdown voltage (element voltage) of the semiconductor element can be enhanced.

Thus, it is an object of the present invention to provide an epitaxial substrate for semiconductor elements which suppresses a leakage current and has a high breakdown voltage.

BRIEF DESCRIPTION OF DRAWINGS

FIG. 1 is a drawing schematically illustrating a cross-sectional structure of an HEMT element 20.

DESCRIPTION OF EMBODIMENT(S)

Figure 2:
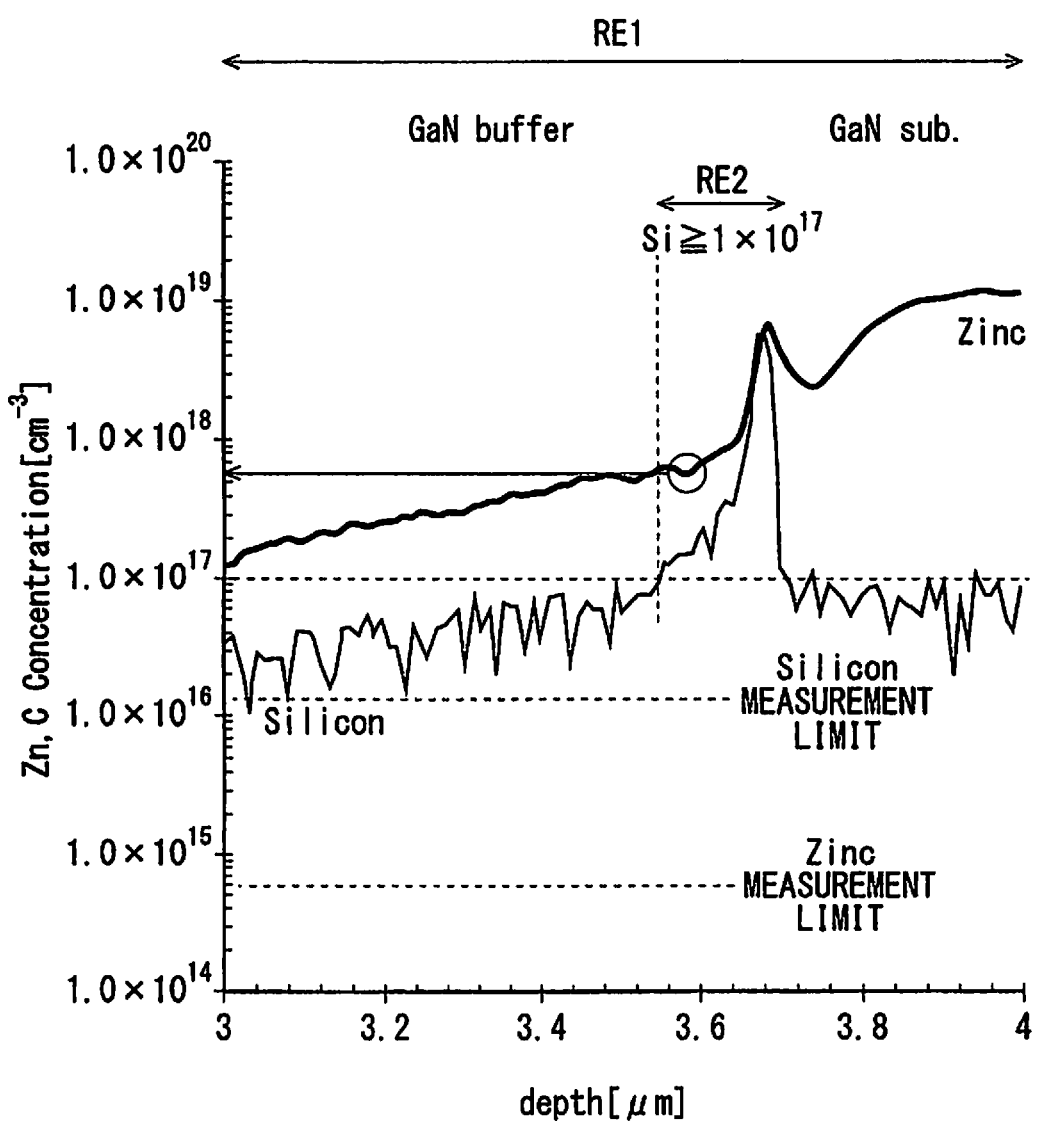
FIG. 2 is a drawing illustrating a concentration profile of Zn element and Si element in a neighborhood of an interface between a GaN buffer layer and a GaN substrate in an Example 1.

Group numbers of a periodic table in the present specification are according to the explanation of group numbers 1 to 18 in the nomenclature of inorganic chemistry revised in 1989 by the international union of pure applied chemistry (IUPAC). Group 13 refers to, for example, aluminum (Al), gallium (Ga), and indium (In), group 14 refers to, for example, silicon (Si), germanium (Ge), tin (Sn), and lead (Pb), and group 15 refers to, for example, nitrogen (N), phosphorous (P), arsenic (As), and antimony (Sb).

<Summary of Epitaxial Substrate and HEMT Element>

FIG. 1 is a drawing schematically illustrating a cross-sectional structure of an HEMT element 20 as one embodiment of a semiconductor element according to the present invention, which includes an epitaxial substrate 10 as one embodiment of an epitaxial substrate for semiconductor elements according to the present invention.

The epitaxial substrate 10 includes a free-standing substrate 1, a buffer layer 2, a channel layer 3, and a barrier layer 4. The HEMT device 20 comprises a source electrode 5, a drain electrode 6, and a gate electrode 7 disposed on the epitaxial substrate 10 (on the barrier layer 4). The ratios of the respective layers in FIG. 1 do not reflect the actual ones.

The free-standing substrate 1 is a GaN substrate doped with $\times 10^{18} \text{cm}^{-3}$ or more of Zn and has a (0001) plane orientation, a resistivity of $1 \times 10^2$ Ωcm or more at room temperature and semi-insulation properties. Although the size of the free-standing substrate 1 is not particularly limited, the free-standing substrate 1 preferably has a thickness of approximately several hundreds of μm to several mm in consideration of, for example, ease of handling. The free-standing substrate 1 can be manufactured by a flux method, for example.

The free-standing substrate 1 formed by the flux method is obtained by the following processes briefly of: immersing a seed substrate in a melt containing metal Ga, metal Na, metal Zn, and C (carbon) in a growing vessel (alumina crucible) disposed to be horizontally rotatable in a pressure vessel; keeping a predetermined temperature and a predetermined pressure in the growing vessel with the introduction of nitrogen gas, while horizontally rotating the growing vessel; and then separating a GaN single crystal, which is resultantly formed on the seed substrate from the seed substrate. A so-called template substrate in which a GaN thin film is formed on a sapphire substrate by a MOCVD method can be preferably used as the seed substrate.

The buffer layer 2 is a layer formed of a group 13 nitride, (adjacently) formed on one main surface of the free-standing substrate 1. The buffer layer 2 may be a single layer which is wholly formed of a group 13 nitride or may be a multi-layered buffer layer which is formed of two or more group 13 nitride layers having different compositions. Examples of the single layer include, for example, a GaN buffer layer which is wholly made of GaN. Examples of the multi-layered buffer layer include, for example, a configuration that a GaN layer is laminated on a $Al_aGa_{1-a}N$ layer ($0 < a \leq 1$). Alternatively, the buffer layer 2 may be provided as a composition gradient buffer layer formed of a group 13 nitride containing two or more group 13 elements (for example, Ga and Al), each element having an existence ratio (mole fraction) changed in a thickness direction. The buffer layer 2 is formed to have a thickness of approximately 50 to 1000 nm. In the present embodiment, the buffer layer 2 is formed at a temperature substantially the same as or higher than a formation temperature of the channel layer 3 and the barrier layer 4, differing from a so-called low-temperature buffer layer formed at a low temperature lower than 800° C.

In the epitaxial substrate 10 according to the present embodiment, Zn, with which the free-standing substrate 1 is doped, is diffused into at least the buffer layer 2. This point is described hereinafter.

The channel layer 3 is a layer (adjacently) formed on the buffer layer 2. The channel layer 3 is formed to have a thickness of approximately 50 to 5000 nm. The barrier layer 4 is a layer provided on an opposite side of the buffer layer 2 with the channel layer 3 therebetween. The barrier layer 4 is formed to have a thickness of approximately 2 to 40 nm.

The barrier layer 4 may be formed adjacent to the channel layer 3 as illustrated in FIG. 1, and in this case, an interface therebetween is a hetero junction interface. Alternatively, a spacer layer not shown may be provided between the channel layer 3 and the barrier layer 4, and in this case, a region from an interface between the channel layer 3 and the spacer layer and an interface between the barrier layer 4 and the spacer layer is a hetero junction interface region.

In any case, as a preferred example, the channel layer 3 is formed of GaN, and the barrier layer 4 is formed of AlGaN ($Al_xGa_{1-x}N$, $0<x<1$) or InAlN $0<y<1$). However, a combination of the channel layer 3 and the barrier layer 4 is not limited thereto.

The formation of the buffer layer 2, the channel layer 3, and the barrier layer 4 is achieved by the MOCVD method, for example. In a case where the buffer layer 2 and the channel layer 3 are formed of GaN and the barrier layer 4 is formed of AlGaN, for example, the layer formation by the MOCVD method can be performed, using a publicly known MOCVD furnace capable of supplying an organic metal (MO) source gas for Ga and Al (TMG and TMA), ammonia gas, hydrogen gas, and nitrogen gas into a reactor, by heating the free-standing substrate 1 disposed in the reactor to a predetermined temperature and depositing a GaN crystal and an AlGaN crystal generated by a gas phase reaction between the organic metal source gas corresponding to each layer and the ammonia gas on the free-standing substrate 1 in sequence.

The source electrode 5 and the drain electrode 6 are metal electrodes each having a thickness of approximately ten and several nm to a hundred and several tens of nm. The source electrode 5 and the drain electrode 6 are preferably formed as multi-layered electrodes of, for example, Ti/Al/Ni/Au. The source electrode 5 and the drain electrode 6 have ohmic contact with the barrier layer 4. The source electrode 5 and the drain electrode 6, as a preferred example, are formed by a vacuum evaporation method and a photolithography process. It is preferable to perform a thermal treatment for several tens of seconds in a nitrogen gas atmosphere at a predetermined temperature of 650 to 1000° C. after forming the electrodes 5 and 6 to enhance the ohmic contact of those electrodes.

The gate electrode 7 is a metal electrode having a thickness of approximately ten and several nm to a hundred and several tens of nm. The gate electrode 7 is preferably formed as a multi-layered electrode of, for example, Ni/Au. The gate electrode 7 has Schottky contact with the barrier layer 4. The gate electrode 7, as a preferred example, is formed by a vacuum evaporation method and a photolithography process.

<Method of Manufacturing Epitaxial Substrate and HEMT Element>
(Manufacture of Free-Standing Substrate)

A procedure of manufacturing the free-standing substrate 1 by the flux method is firstly described.

Firstly, a c-plane sapphire substrate having a diameter substantially the same as that of the free-standing substrate 1 to be manufactured is prepared, and a GaN low-temperature buffer layer is formed on a surface of the c-plane sapphire substrate to have a thickness of approximately 10 to 50 nm at a temperature of 450 to 750° C. Subsequently, a GaN thin film having a thickness of approximately 1 to 10 μm is formed by the MOCVD method at a temperature of 1000 to 1200° C., thereby obtaining a MOCVD-GaN template usable as a seed substrate.

Next, a Zn-doped GaN single crystal layer is formed by a Na flux method using the MOCVD-GaN template which has been obtained as the seed substrate.

Specifically, the MOCVD-GaN template is firstly disposed in an alumina crucible, and subsequently, the alumina crucible is filled with 10 to 60 g of metal Ga, 15 to 90 g of metal Na, 0.4 to 5 g of metal Zn, and 10 to 500 mg of C.

The alumina crucible is put in a heating furnace and heated for approximately 20 to 400 hours with a furnace temperature of 800 to 950° C. and a furnace pressure of 3 to 5 MPa, and subsequently cooled to room temperature. After finishing cooling, the alumina crucible is taken out of the furnace. As a result of the above procedure, a brown GaN single crystal layer with a thickness of 300 to 3000 μm is deposited on the surface of the MOCVD-GaN template.

The GaN single crystal layer which has been obtained in such a manner is ground with diamond abrasive grains to planarize a surface thereof. The Flux-GaN template having the GaN single crystal layer formed on the MOCVD-GaN template is thereby obtained. However, the grinding is performed to the extent that a total thickness of a nitride layer on the Flux-GaN template is sufficiently larger than a targeted thickness of the free-standing substrate 1 to be obtained eventually.

Subsequently, by a laser lift off method in which laser light is emitted from a side of the seed substrate to perform scanning at a scan speed of 0.1 to 100 mm/sec., the seed substrate is separated from the Flux-GaN template. Third harmonic of Nd: YAG having a wavelength of 355 nm, for example, is preferably used as the laser light. In the above case, a pulse width may be set to approximately 1 to 1000 ns and a pulse period may be set to approximately 1 to 200 kHz. In emitting the laser light, it is preferable to appropriately collect the laser light to adjust the light density. It is preferable to emit the laser light while heating the Flux-GaN template from a side opposite to the seed substrate at a temperature of approximately 30 to 600° C.

After separating the seed substrate, a grinding processing is performed on a surface, from which the seed substrate has been detached, of a laminated structure which has been obtained. The free-standing substrate 1 formed of GaN containing Zn doped at a concentration of $1 \times 10^{18} cm^{-3}$ or more is thereby obtained.

(Manufacture of Epitaxial Substrate)

Subsequently, a manufacture of the epitaxial substrate 10 by the MOCVD method is described. The epitaxial substrate 10 is obtained by laminating the buffer layer 2, the channel layer 3, and the barrier layer 4 in this order under the following condition in a state where the free-standing substrate 1 is disposed on a susceptor provided in the reactor in the MOCVD furnace. However, described as an example of the buffer layer 2 is a case where a single GaN buffer layer or a multi-layered buffer layer or a composition gradient buffer layer containing Ga and Al as a group 13 element is formed. The formation temperature means a susceptor heating temperature.

In the present embodiment, a gas ratio of group 15 to group 13 is a ratio (molar ratio) of a supply amount of ammonia, which is a group 15 (N) source, to a total supply amount of trimethylgallium (TMG), trimethylaluminum (TMA), and trimethylindium (TMI), which are group 13 (Ga, Al, and In) sources. A gas ratio of an Al source gas to a group 13 source gas in a case of making the barrier layer 4 of AlGaN is a ratio (molar ratio) of a supply amount of an Al source to a supply amount of whole group 13 (Ga, Al) sources, and a gas ratio of an In source gas to a group 13 source gas in a case of making the barrier layer 4 of InAlN is a ratio (molar ratio) of a supply amount of an In source to a supply amount of whole group 13 (In, Al) sources. Both are defined in accordance with a composition (an Al molar ratio x or an In composition ratio y) of a desired barrier layer 4.

Buffer Layer 2:
  Formation temperature=1000 to 1200° C.;
  Reactor pressure=15 to 105 kPa;
  Carrier gas=hydrogen;
  Gas ratio of group 15 to group 13=250 to 10000;
  Gas ratio of Al source gas to group 13 source gas=0 (in a case of the GaN buffer layer);
  Gas ratio of Al source gas to group 13 source gas=ranging from 0 to 1 in accordance with a position in the thickness direction (in a case of the multi-layered buffer layer or the composition gradient buffer layer).

Channel Layer 3:
  Formation temperature=1000 to 1150° C.;
  Reactor pressure=15 to 105 kPa;
  Carrier gas=hydrogen;
  Gas ratio of group 15 to group 13=1000 to 10000.

Barrier layer 4 (in a case of formed of AlGaN):
  Formation temperature=1000 to 1200° C.;
  Reactor pressure=1 to 30 kPa;
  Gas ratio of group 15 to group 13=5000 to 20000;
  Carrier gas=hydrogen;
  Gas ratio of Al source gas to group 13 source gas=0.1 to 0.4.

Barrier Layer 4 (in a Case of Formed of InAlN):
  Formation temperature=700 to 900° C.;
  Reactor pressure=1 to 30 kPa;
  Gas ratio of group 15 to group 13=2000 to 20000;
  Carrier gas=nitrogen;
  Gas ratio of In source gas to group 13 source gas=0.1 to 0.9.

(Manufacture of HEMT Element)

The HEMT element 20 using the epitaxial substrate 10 can be manufactured by applying a publicly known technique.

For example, after an element separation processing of removing a portion of a boundary between individual elements by performing etching to approximately 50 to 1000 nm, using a photolithography process and a RIE method, an SiO$_2$ film having a thickness of 50 to 500 nm is formed on a surface of the epitaxial substrate 10 (the surface of the barrier layer 4), and then the SiO$_2$ film at locations where the source electrode 5 and the drain electrode 6 are to be formed is removed by etching using the photolithography process, thereby obtaining an SiO$_2$ pattern layer.

Next, a metal pattern of Ti/Al/Ni/Au is formed at the locations where the source electrode 5 and the drain electrode 6 are to be formed by the vacuum deposition method and the photolithography process, thereby forming the source electrode 5 and the drain electrode 6. The metal layers preferably have thicknesses of 5 to 50 nm, 40 to 400 nm, 4 to 40 nm, and 20 to 200 nm in this order, respectively.

Subsequently, a thermal treatment is performed for 10 to 1000 seconds in a nitrogen gas atmosphere at a temperature of 600 to 1000° C. to improve the ohmic contact of the source electrode 5 and the drain electrode 6.

Then, the SiO$_2$ film at locations where the gate electrode 7 is to be formed is removed from the SiO$_2$ pattern layer using the photolithography process.

Furthermore, a Schottky metal pattern of Ni/Au is formed at a location for formation on the gate electrode 7 by the vacuum deposition method and the photolithography process, thereby forming the gate electrode 7. The metal layers preferably have thicknesses of 4 to 40 nm and 20 to 200 nm, respectively.

The HEMT element 20 is obtained by the processes described above.

<Uneven Distribution of Si and Diffusion of Zn>

In the HEMT element 20 manufactured under the procedures and the conditions described above, when a region consisting of the free-standing substrate 1 and the buffer layer 2 is defined as a first region, part of the first region has a second region containing Si' at a high concentration of $1\times10^{17} cm^{-3}$ or more. Since Si is not purposely contained in the process of manufacturing the HEMT element 20, particularly in the process of manufacturing the free-standing substrate 1 and adjacently forming the buffer layer 2 on the free-standing substrate 1, containing Si at the concentration described above in the second region is considered to be a result that Si, which had been taken from outside halfway through the process, remains after the formation of the HEMT element 20. More specifically, the second region includes the interface between the free-standing substrate 1 and the buffer layer 2. However, the second region is not formed in the free-standing substrate 1.

In addition, in the HEMT element 20 according to the present embodiment, Zn, with which the free-standing substrate 1 is doped, is diffused into at least the buffer layer 2. Furthermore, Zn is contained in the whole range of the second region described above at the concentration of $1\times10^{17} cm^{-3}$ or more (Zn is contained so that a minimum value of the concentration in the second region is $1\times10^{17} cm^{-3}$).

In the HEMT element 20 according to the present embodiment, as a result that the above condition of the concentration is satisfied, the leakage current is reduced in driving, and a high breakdown voltage (high element voltage) is achieved.

In the meanwhile, in the HEMT element having the minimum value of the Zn concentration in the second region smaller than $1\times10^{17} cm^{-3}$, it is confirmed that the leakage current increases and the breakdown voltage is low.

Si taken from outside may function as the donor element, and when the diffusion of Zn satisfying the concentration condition described above does not occur, the conductive layer which serves as the leakage pathway of the drain-source current is formed in the HEMT element by the function, and there is a possibility of the reduction in the pinch-off characteristics and the reduction of the breakdown voltage. However, when Zn is contained so that the minimum value of the concentration in the second region is $1\times10^{17} cm^{-3}$, it is considered that Zn inhibits Si functioning as the donor element.

That is to say, according to the present embodiment, the semiconductor element in which the leakage current in driving the semiconductor element is reduced and the breakdown voltage (the element voltage) is enhanced can be obtained.

EXAMPLES

Example 1

Manufacture of Zn-Doped GaN Single Crystal Substrate by a Flux Method

A GaN low-temperature buffer layer is formed to have a thickness of 30 nm at a temperature of 550° C. on a surface of a c-plane sapphire substrate having a diameter of 2 inches and a thickness of 0.43 mm, and subsequently, a GaN thin film having a thickness of 3 μm is formed by the MOCVD method at a temperature of 1050° C., thereby obtaining a MOCVD-GaN template usable as a seed substrate.

A Zn-doped GaN single crystal layer is formed by the Na flux method using the MOCVD-GaN template which has been obtained as the seed substrate.

Specifically, the MOCVD-GaN template was firstly disposed in an alumina crucible, and subsequently, the alumina crucible was filled with 30 g of metal Ga, 45 g of metal Na, 1 g of metal Zn, and 100 mg of C. The alumina crucible was put in a heating furnace and heated for approximately 100 hours with a furnace temperature of 850° C. and a furnace pressure of 4.5 MPa, and subsequently cooled to room temperature. When the alumina crucible was taken out of the furnace after finishing cooling, a brown GaN single crystal layer was deposited on the surface of the MOCVD-GaN template with a thickness of approximately 1000 μm.

The GaN single crystal layer which had been obtained in such a manner was ground with diamond abrasive grains so that the surface thereof was planarized and the nitride layer formed on a base substrate had a total thickness of 900 μm. The Flux-GaN template having the GaN single crystal layer formed on the MOCVD-GaN template was thereby obtained. When the Flux-GaN template was viewed with the naked eye, no cracking was found thereon.

Subsequently, by a laser lift-off method in which laser light was emitted from a side of the seed substrate to perform scanning at a scan speed of 30 mm/sec., the seed substrate was separated from the Flux-GaN template. Third harmonic of Nd: YAG having a wavelength of 355 nm was used as the laser light. A pulse width was set to approximately 30 ns and a pulse period was set to approximately 50 kHz. In emitting the laser light, the laser light was collected to have a circular shape with a diameter of approximately 20 μm, thereby having a light density of approximately 1.0 J/cm. The laser light was emitted while heating the Flux-GaN template from a side opposite to the seed substrate at a temperature of around 50° C.

After separating the seed substrate, a grinding processing was performed on a surface, from which the seed substrate had been detached, of a laminated structure which had been obtained, thereby obtaining a Zn-doped GaN free-standing substrate having a total thickness of 430 μm.

The crystallinity of the Zn-doped GaN substrate which had been obtained was evaluated with an X-ray rocking curve. A half-value width of (0002) plane reflection was 120 seconds and a half-value width of (10-12) plane reflection was 150 seconds, both showing favorable crystalline nature.

Manufacture of Epitaxial Substrate by MOCVD Method

Subsequently, an epitaxial substrate was manufactured by the MOCVD method. Specifically, a GaN layer as a buffer layer, a GaN layer as a channel layer, and an AlGaN layer as a barrier layer were laminated on the Zn-doped GaN substrate described above in this order under the following condition. In the present embodiment, a gas ratio of group 15 to group 13 is a ratio (molar ratio) of a supply amount of a group 15 (N) source to a supply amount of group 13 (Ga, Al) sources. A gas ratio of an Al source gas to a group 13 source gas is a ratio (molar ratio) of a supply amount of an Al source to a supply amount of whole group 13 (Ga, Al) sources.

GaN Buffer Layer:
  Formation temperature=1150 ° C.;
  Reactor pressure=15 kPa;
  Gas ratio of group 15 to group 13=1000;
  Thickness=600 nm.
GaN Channel Layer:
  Formation temperature=1050° C.;
  Reactor pressure=15 kPa;
  Gas ratio of group 15 to group 13=1000;
  Thickness=3000 nm.
AlGaN Barrier Layer:
  Formation temperature=1050 ° C.;
  Reactor pressure=5 kPa;
  Gas ratio of group 15 to group 13=12000;
  Gas ratio of an Al source gas to a group 13 source gas=0.25;
  Thickness=25 nm.

After the formation of the layers described above, the susceptor temperature was lowered to around room temperature, and the internal gas of the reactor was returned to atmospheric pressure. Then, the epitaxial substrate which had been manufactured was taken out.

Manufacture of HEMT Element

Subsequently, the HEMT element 20 was manufactured using the epitaxial substrate 10. The HEMT element was designed to have a gate width of 100 μm, a source-gate distance of 1 μm, a gate-drain distance of 10 μm, and a gate length of 1 μm.

Firstly, a portion of a boundary between individual elements was removed by etching to a depth of approximately 100 nm using the photolithography process and the RIE method.

Next, the SiO$_2$ film having a thickness of 100 nm was formed on the epitaxial substrate, and then the SiO$_2$ film at locations where the source electrode and the drain electrode were to be formed was removed by etching using the photolithography process, thereby obtaining an SiO$_2$ pattern layer.

Next, a metal pattern of Ti/Al/Ni/Au (each having a film thickness of 25/200/20/100 nm) was formed at the locations where the source electrode and the drain electrode were to be formed by the vacuum deposition method and the photolithography process, thereby forming the source electrode and the drain electrode. Subsequently, a thermal treatment is performed for 30 seconds in a nitrogen gas atmosphere at a temperature of 825° C. to improve the ohmic contact of the source electrode and the drain electrode.

Then, the SiO$_2$ film at locations where the gate electrode was to be formed was removed from the SiO$_2$ pattern layer using the photolithography process.

Furthermore, a Schottky metal pattern of Ni/Au (each having a film thickness of 20/100 nm) was formed at the locations where the gate electrode was to be formed by the vacuum deposition method and the photolithography process, thereby forming the gate electrode.

The HEMT element was obtained by the processes described above.

SIMS Evaluation of HEMT Element

An element analysis in the depth direction was performed on the HEMT element, which had been obtained, by secondary ion mass spectrometry (SIMS), and each concentration of the Zn element and the Si element in the AlGaN barrier layer, the GaN channel layer, the GaN buffer layer, and the GaN substrate was examined.

FIG. 2 is drawing illustrating a concentration profile of Zn element and Si element in a neighborhood of an interface between a GaN buffer layer and a GaN substrate. A result illustrated in FIG. 2 shows the following matters.

(1) The GaN substrate is doped with the Zn element at a high concentration ($1\times10^{19}$cm$^{-3}$).

(2) In a first region RE1 consisting of the GaN substrate and the GaN buffer layer, a second region RE2 containing the Si element at a high concentration of $1\times10^{17}$cm$^{-3}$ or more is formed in a neighborhood of an interface between the GaN substrate and the GaN buffer layer, and a peak concentration of the Si element is $6\times10^{18}$cm$^{-3}$.

(3) In the GaN buffer layer, the Zn concentration gradually decreases compared to the Si concentration. That is to say, the Zn element is significantly diffused compared to the Si element in the GaN buffer layer.

(4) A minimum value of the Zn concentration in the second region RE2 is $5.3\times10^{17}$cm$^{-3}$ ($\geq 1\times10^{17}$cm$^{-3}$)

Electrical characteristics evaluation of HEMT element

Drain current-drain voltage characteristics (Id-Vd characteristics) of the HEMT element were evaluated in a DC mode using a semiconductor parameter analyzer. A pinch-off threshold voltage was Vg=−3V.

Adopted as an index for evaluating the drain current leakage amount at the time of pinch-off was the drain current $Id_{Vd=10V \cdot Vg=-10V}$ in a case of applying the drain voltage Vd=10V and the gate voltage Vg=−10V. The drain current $Id_{Vd=10V \cdot Vg=-10V}$ was calculated to be $3\times10^{-7}$A in the case of the HEMT element according to the present Example. $Id_{Vd=10V \cdot Vg=-10V}$ is preferably as small as possible, and it can be determined that the drain current leakage amount is small when $Id_{Vd=10V \cdot Vg=-10V} \leq 1\times10^{-5}$A/mm is satisfied in a value normalized with the gate width. In the case of the HEMT element according to the present Example, the drain current leakage amount normalized with the gate width of 100 μm is calculated to be $33\times10^{-6}$A/mm, thus is determined to be sufficiently small.

Subsequently, an element breakdown voltage was measured. Adopted as an index for evaluating the element breakdown voltage was the drain voltage Vdb in which the drain current Id exceeded $1\times10^{-5}$A for the first time ($1\times10^{-4}$A/mm in case of being normalized with the gate width of 100 μm) when the drain voltage Vd was gradually increased from 0V while applying the gate voltage Vg=−10V. The drain voltage was calculated to be 850V in the case of the HEMT element according to the present Example. Vdb is preferably as large as possible, and it can be determined that the element breakdown voltage is sufficient when Vdb≥300V is satisfied, thus the element breakdown voltage of the HEMT element according to the present Example is determined to be sufficiently large.

Comparative Example 1

The HEMT element was manufactured under conditions similar to that of Example 1 except that the growth condition of the GaN buffer layer was as follows, differing from Example 1.

GaN buffer layer:
Formation temperature=1050° C.;
Reactor pressure=15 kPa;
Gas ratio of group 15 to group 13=1000;
Thickness=600 nm.

Figure 3:
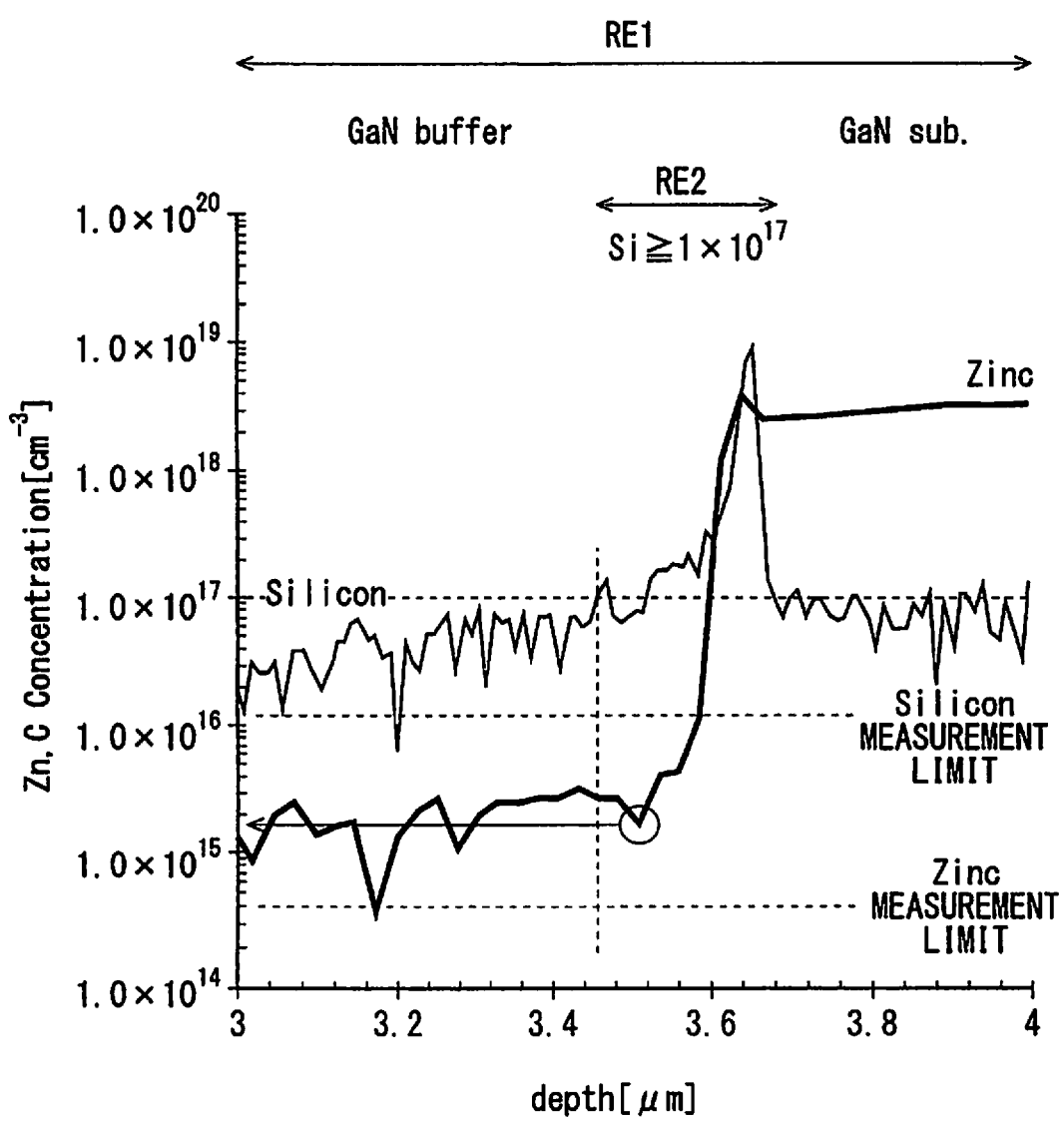
FIG. 3 is a drawing illustrating a concentration profile of Zn element and Si element in a neighborhood of an interface between a GaN buffer layer and a GaN substrate in a Comparative Example 1.

FIG. 3 illustrates a concentration profile of the Zn element and the Si element in the neighborhood of the interface between the GaN buffer layer and the GaN substrate obtained by performing the SIMS measurement on the HEMT element, which has been obtained, under conditions similar to that of Example 1. A result illustrated in FIG. 3 shows the following matters.

(1) The GaN substrate is doped with the Zn element at a high concentration in the manner similar to the Example 1.

(2) In the first region RE1 consisting of the GaN substrate and the GaN buffer layer, the second region RE2 is formed in the neighborhood of the interface between the GaN substrate and the GaN buffer layer in the manner similar to Example 1.

(3) In the GaN buffer layer, the Zn concentration comparatively sharply decreases compared to the Si concentration, differing from Example 1. That is to say, the diffusion of the Zn element is suppressed compared to the diffusion of the Si element in the GaN buffer layer.

(4) A minimum value of the Zn concentration in the second region RE2 is $1.7\times10^{15}$cm$^{-3}$ ($<1\times10^{17}$cm$^{-3}$).

$Id_{Vd=10V \cdot Vg=-10V}$ of the HEMT element was calculated to be $8\times10^{-5}$A ($8\times10^{-4}$A/mm in case of being normalized with the gate width of 100 μm) under the condition similar to that of the Example 1. That is to say, it was confirmed that the drain current leakage amount was large, and the HEMT element according to the present Comparative Example did not have sufficient pinch-off characteristics.

Vdb was calculated to be 100V under conditions similar to that of the Example 1, thus sufficient element breakdown voltage was not obtained.

Examples 2 to 6, Comparative Examples 2 to 3

The HEMT elements were manufactured under conditions similar to that of Example 1 except that the growth conditions of the GaN buffer layer (the growth temperature, the reactor pressure, the gas ratio of group 15 to group 13, and the formation thickness), for example, were variously changed. Then, the distribution in the depth direction of the Zn concentration and the Si concentration in the HEMT element, which had been obtained, was obtained by the SIMS measurement, and the $Id_{Vd=10V \cdot Vg=-10V}$ and Vdb were measured.

A list of the results thereof is shown by Table 1 together with the results of Example 1 and Comparative Example 1.

TABLE 1

| | Growth condition of GaN buffer layer | | | | Leakage current evaluation $Id_{Vd=10V \cdot Vg=-10V}$ [A/mm] | Element breakdown voltage Vdb [V] | SIMS measurement Minimum value of Zn concentration in region where Si concentration is equal to or larger than $1\times10^{17}$ cm$^{-3}$ [cm$^{-3}$] |
| --- | --- | --- | --- | --- | --- | --- | --- |
| | Growth temperature [° C.] | Reactor pressure [kPa] | Gas ratio of group 15 to group 13 | Thickness [nm] | | | |
| Example 1 | 1150 | 15 | 1000 | 600 | $3\times10^{-6}$ | 850 | $5.3\times10^{17}$ |
| Example 2 | 1100 | 15 | 1000 | 600 | $4\times10^{-6}$ | 820 | $5.3\times10^{17}$ |
| Comparative Example 1 | 1050 | 15 | 1000 | 600 | $8\times10^{-4}$ | 100 | $1.7\times10^{15}$ |
| Example 3 | 1050 | 30 | 1000 | 600 | $6\times10^{-6}$ | 620 | $1.6\times10^{17}$ |
| Example 4 | 1050 | 45 | 1000 | 600 | $6\times10^{-6}$ | 690 | $3.6\times10^{17}$ |
| Example 5 | 1050 | 15 | 2000 | 600 | $9\times10^{-6}$ | 450 | $1.0\times10^{17}$ |

TABLE 1-continued

| | Growth condition of GaN buffer layer | | | | Leakage current evaluation $Id_{Vd=10V,Vg=-10V}$ [A/mm] | Element breakdown voltage Vdb [V] | SIMS measurement Minimum value of Zn concentration in region where Si concentration is equal to or larger than $1 \times 10^{17}$ cm$^{-3}$ [cm$^{-3}$] |
|---|---|---|---|---|---|---|---|
| | Growth temperature [° C.] | Reactor pressure [kPa] | Gas ratio of group 15 to group 13 | Thickness [nm] | | | |
| Example 6 | 1050 | 15 | 4000 | 600 | $4 \times 10^{-6}$ | 500 | $4.1 \times 10^{17}$ |
| Comparative Example 2 | 1050 | 15 | 1000 | 300 | $1 \times 10^{-3}$ | 85 | $2.3 \times 10^{15}$ |
| Comparative Example 3 | 1050 | 15 | 1000 | 1200 | $7 \times 10^{-3}$ | 115 | $5.1 \times 10^{15}$ |

As indicated by Table 1, in the cases of Examples 1 to 6, manufactured under the condition where the minimum value of the concentration of Zn in the region RE2 was equal to or larger than $1 \times 10^{17}$ cm$^{-3}$, the HEMT element having the small drain current leakage amount ($Id_{Vd=10V,Vg=-10V} \leq 1 \times 10^{-5}$ A/mm) and the large element breakdown voltage (Vdb≥300V) could be obtained. In the meanwhile, in the cases of Comparative Examples 1 to 3 manufactured under the condition where the minimum value of the concentration of Zn in the region RE2 was smaller than $1 \times 10^{17}$ cm$^{-3}$, only the HEMT element having a large drain current leakage amount and small element breakdown voltage could be obtained.

Example 7

The epitaxial substrate 10 and, further, the HEMT element 20 were manufactured under conditions similar to that of Example 1 except that the growth condition of the buffer layer 2 and the channel layer 3 was as follows, differing from Example 1. In the formation of the buffer layer 2 in the above processing, the formation condition is set in two stages of a first condition and a second condition, and is switched from the first condition to the second condition halfway through the formation. This is intended to form the buffer layer 2 as the multi-layered buffer layer in which the GaN layer is laminated on the $Al_aGa_{1-a}N$ layer (0<a≤1) or the composition gradient buffer layer in which the existence ratio of Al and Ga is different in the thickness direction. The total thickness of the buffer layer 2 was set to 110 nm.
Buffer Layer (First Condition):
  Formation temperature=1050° C.;
  Reactor pressure=5 kPa;
  Group 13 source gas=Al source and Ga source;
  Gas ratio of group 15 to group 13=2000;
  Gas ratio of Al source gas to group 13 source gas=0.03;
  Growth rate=1 nm/sec.;
  Growth time=10 seconds.
Buffer Layer (Second Condition):
  Formation temperature=1050° C.;
  Reactor pressure=10 kPa;
  Group 13 source gas=Ga source;
  Gas ratio of group 15 to group 13=500;
  Growth rate=1 nm/sec.;
  Growth time=100 seconds.
GaN Channel Layer:
  Formation temperature=1050° C.;
  Reactor pressure=100 kPa;
  Gas ratio of group 15 to group 13=2000;
  Thickness=900 nm.

Figure 4:
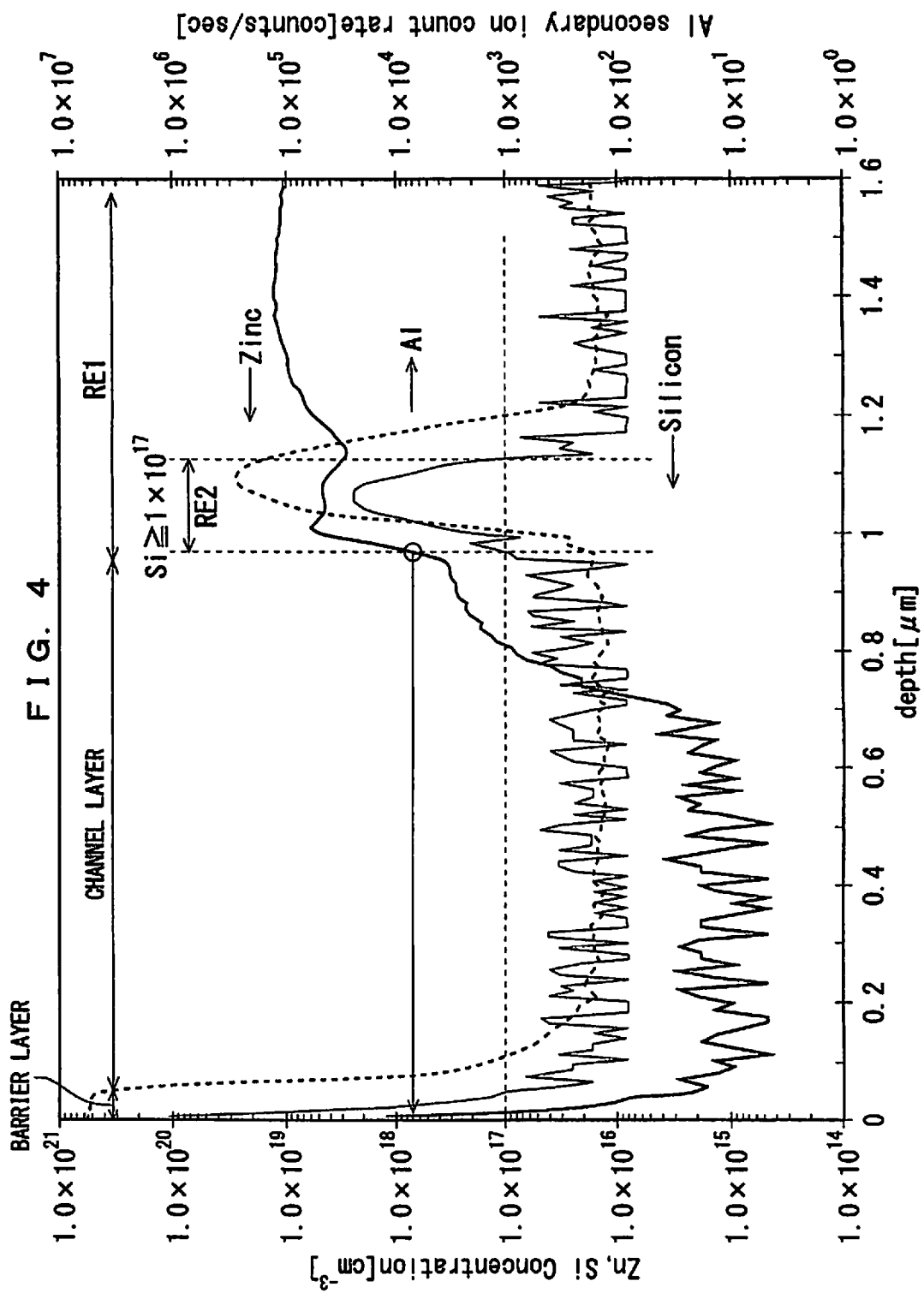
FIG. 4 is a drawing illustrating a concentration profile of Zn element and Si element from a surface of a barrier layer 4 in a depth direction and a secondary ion signal profile of Al element in an Example 7.

FIG. 4 is a drawing illustrating a concentration profile of the Zn element and the Si element from the surface (upper surface) of the barrier layer 4 in the depth direction obtained by performing the measurement on the HEMT element, which has been obtained, in the depth direction by the SIMS measurement under conditions similar to that of Example 1 and a secondary ion signal profile of the Al element in the depth direction (a distribution of a secondary ion count rate of the Al element in the depth direction). The result illustrated in FIG. 4 shows the following matters.

(1) The GaN substrate is doped with the Zn element at a high concentration.

(2) In the first region RE1 consisting of the GaN substrate and the buffer layer, the second region RE2 containing the Si element at the high concentration of $1 \times 10^{17}$ cm$^{-3}$ or more is formed in the neighborhood of the interface between the GaN substrate and the buffer layer, and the peak concentration of the Si element is $3 \times 10^{18}$ cm$^{-3}$.

(3) The Si concentration has a peak in the second region RE2 and sharply decreases with a decreasing distance to the channel layer, however, the reduction in the Zn concentration from the buffer layer to the channel layer is gradual. That is to say, the Zn element is significantly diffused compared to the Si element. Specifically, in the channel layer, the Zn element is diffused to the range of 200 to 250 nm from the interface between the channel layer and the buffer layer (the interface between the channel layer and the first region RE1). (4) A minimum value of the Zn concentration in the second region RE2 is $5.3 \times 10^{17}$ cm$^{-3}$ (≥$1 \times 10^{17}$ cm$^{-3}$).

(5) The Al element is contained in a range wider than 110 nm, which is a targeted thickness of the whole buffer layer, and the range also includes part of the GaN substrate.

$Id_{Vd=10V,Vg=-10V}$ of the HEMT element was calculated to be $8 \times 10^{-8}$ A ($8 \times 10^{-7}$ A/mm in the case of being normalized with the gate width of 100 μm) under conditions similar to that of Example 1. That is to say, it was confirmed that the drain current leakage amount was small, and the HEMT element according to the present Example had favorable pinch-off characteristics.

Vdb was calculated to be 1200V under conditions similar to that of Example 1, thus a sufficient element breakdown voltage was obtained.

Example 8

The HEMT element 20 was manufactured under conditions similar to that of Example 7 except that the growth condition of the buffer layer 2 and the channel layer 3 was as follows, differing from Example 7. That is to say, also in the present Example, in the formation of the buffer layer 2, the formation condition is set in two stages of a first condition and a second condition, and is switched from the first condition to the second condition halfway through the formation. The total thickness of the buffer layer 2 was set to 350 nm.

Buffer Layer (First Condition):
    Formation temperature=1050° C.;
    Reactor pressure=5 kPa;
    Group 13 source gas=Al source and Ga source;
    Gas ratio of group 15 to group 13=2000;
    Gas ratio of Al source gas to group 13 source gas=0.01;
    Growth rate=1 nm/sec.;
    Growth time=50 seconds.

Buffer Layer (Second Condition):
    Formation temperature=1050 ° C.;
    Reactor pressure=10 kPa;
    Gas ratio of group 15 to group 13=500;
    Growth rate=1 nm/sec.;
    Growth time=300 seconds.

GaN Channel Layer:
    Formation temperature=1050 ° C.;
    Reactor pressure=100 kPa;
    Gas ratio of group 15 to group 13=2000;
    Thickness=1700 nm.

A concentration profile of the Zn element and the Si element from the surface (upper surface) of the barrier layer 4 in the depth direction obtained by performing the SIMS measurement on the HEMT element, which has been obtained, under conditions similar to that of Example 1 and a secondary ion signal profile of the Al element in the depth direction show the following matters.

(1) The GaN substrate is doped with the Zn element at a high concentration ($1 \times 10^{19} \text{cm}^{-3}$).

(2) In the first region RE1 consisting of the GaN substrate and the buffer layer, the second region RE2 containing the Si element at the high concentration of $1 \times 10^{17} \text{cm}^{-3}$ or more is formed in the neighborhood of the interface between the GaN substrate and the buffer layer, and the peak concentration of the Si element is $4 \times 10^{18} \text{cm}^{-3}$.

(3) The Si concentration has a peak in the second region RE2 and sharply decreases with a decreasing distance to the channel layer, however, the reduction in the Zn concentration from the buffer layer to the channel layer is gradual. That is to say, the Zn element is significantly diffused compared to the Si element.

(4) A minimum value of the Zn concentration in the second region RE2 is $8.2 \times 10^{17} \text{cm}^{-3}$ ($\geq 1 \times 10^{17} \text{cm}^{-3}$).

(5) The Al element is contained in a range wider than 350 nm which is a targeted thickness of the whole buffer layer, and the range also includes part of the GaN substrate.

$\text{Id}_{Vd=10V, Vg=10V}$ of the HEMT element was calculated to be $2 \times 10^{-7}$A ($2 \times 10^{-6}$A/mm in the case of being normalized with the gate width of 100 µm) under conditions similar to that of Example 1. That is to say, it was confirmed that the drain current leakage amount was small, and the HEMT element according to the present Example had favorable pinch-off characteristics.

Vdb was calculated to be 1050V under conditions similar to that of Example 1, thus a sufficient element breakdown voltage was obtained.

What is claimed is:

1. A method of manufacturing an epitaxial substrate for semiconductor elements, comprising:

a) a preparation step of preparing a first region consisting of a semi-insulating free-standing substrate formed of GaN being doped with Zn;

b) a buffer layer formation step of forming a buffer layer formed of group 13 nitride adjacent to said free-standing substrate;

c) a channel layer formation step of forming a channel layer formed of group 13 nitride adjacent to said buffer layer; and d) a barrier layer formation step of forming a barrier layer formed of group 13 nitride in a position opposite to said buffer layer with said channel layer therebetween, wherein a second region containing Si at a concentration of $1 \times 10^{17} \text{cm}^{-3}$ or more is formed through taking Si in said free-standing substrate, which has been prepared in said preparation step, from outside before said buffer layer formation step is completed, in part of a first region consisting of said free-standing substrate and said buffer layer, and in said buffer layer formation step, Zn is diffused from said free-standing substrate, thereby forming said buffer layer in which a minimum value of a concentration of Zn is $1 \times 10^{17} \text{cm}^{-3}$ in said second region.

2. The method of manufacturing the epitaxial substrate for the semiconductor elements according to claim 1, wherein said second region exists in said first region, including an interface between said free-standing substrate and said buffer layer.

3. The method of manufacturing the epitaxial substrate for the semiconductor elements according to claim 1, wherein said free-standing substrate is manufactured by a flux method.

4. The method of manufacturing the epitaxial substrate for the semiconductor elements according to claim 1, wherein said buffer layer is formed of GaN,
said channel layer is formed of GaN, and
said barrier layer is formed of AlGaN.

5. The method of manufacturing the epitaxial substrate for the semiconductor elements according to claim 1, wherein said buffer layer is formed as either of
a multi-layered buffer layer which is formed by laminating two or more group 13 nitride layers having different compositions, or
a composition gradient buffer layer formed of group 13 nitride containing two or more group 13 elements, each element having an existence ratio changed in a thickness direction,
said channel layer is formed of GaN, and
said barrier layer is formed of AlGaN.

6. The method of manufacturing the epitaxial substrate for the semiconductor elements according to claim 2, wherein said free-standing substrate is manufactured by a flux method.

7. The method of manufacturing the epitaxial substrate for the semiconductor elements according to claim 2, wherein said buffer layer is formed of GaN,
said channel layer is formed of GaN, and
said barrier layer is formed of AlGaN.

8. The method of manufacturing the epitaxial substrate for the semiconductor elements according to claim 2, wherein said buffer layer is formed as either of
a multi-layered buffer layer which is formed by laminating two or more group 13 nitride layers having different compositions, or a composition gradient buffer layer formed of group 13 nitride containing two or more group 13 elements, each element having an existence ratio changed in a thickness direction,
said channel layer is formed of GaN, and
said barrier layer is formed of AlGaN.

* * * * *